United States Patent
Crippen et al.

(10) Patent No.: US 7,295,446 B2
(45) Date of Patent: Nov. 13, 2007

(54) MIDPLANE CONNECTOR FOR BLADES

(75) Inventors: Martin J. Crippen, Apex, NC (US);
William G. Holland, Cary, NC (US);
James E. Hughes, Apex, NC (US);
David J. Jensen, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/323,883

(22) Filed: Dec. 30, 2005

(65) Prior Publication Data

US 2007/0153462 A1 Jul. 5, 2007

(51) Int. Cl.
*H01R 12/16* (2006.01)

(52) U.S. Cl. .................... 361/788; 439/377; 439/64

(58) Field of Classification Search ........... 361/683, 361/788, 789; 439/377, 64, 683
See application file for complete search history.

(56) References Cited

U.S. PATENT DOCUMENTS

| | | | |
|---|---|---|---|
| 5,429,521 A * | 7/1995 | Morlion et al. | 439/108 |
| 6,422,876 B1 * | 7/2002 | Fitzgerald et al. | 439/61 |
| 6,483,029 B1 * | 11/2002 | Lutz, Jr. | 174/50 |
| 6,816,486 B1 * | 11/2004 | Rogers | 370/387 |
| 6,945,702 B2 * | 9/2005 | Gherardini | 385/55 |
| 6,950,895 B2 * | 9/2005 | Bottom | 710/301 |

* cited by examiner

*Primary Examiner*—Lisa Lea-Edmonds
*Assistant Examiner*—Ingrid Wright
(74) *Attorney, Agent, or Firm*—Mark McKinley, Esq.; Steven M. Greenberg, Esq.; Carey Rodriguez Greenberg & Paul LLP

(57) ABSTRACT

A computer system includes a plurality of blade servers, a midplane, a supplemental midplane, and a peripheral device separate from the blade servers. The midplane includes a plurality of connectors connecting the midplane to the plurality of blade servers. The supplemental midplane is separate from the midplane and includes a body, a plurality of connectors, and a peripheral connector. The plurality of connectors are attached to the body and connect the supplemental midplane to the plurality of blade servers. The peripheral connector is attached to the body and connects the supplemental midplane to the peripheral device. The plurality of connectors of the supplemental midplane communicate with the peripheral connector of the supplemental midplane. The plurality of connectors of the supplemental midplane are configured to be removably connectable to the midplane.

6 Claims, 4 Drawing Sheets

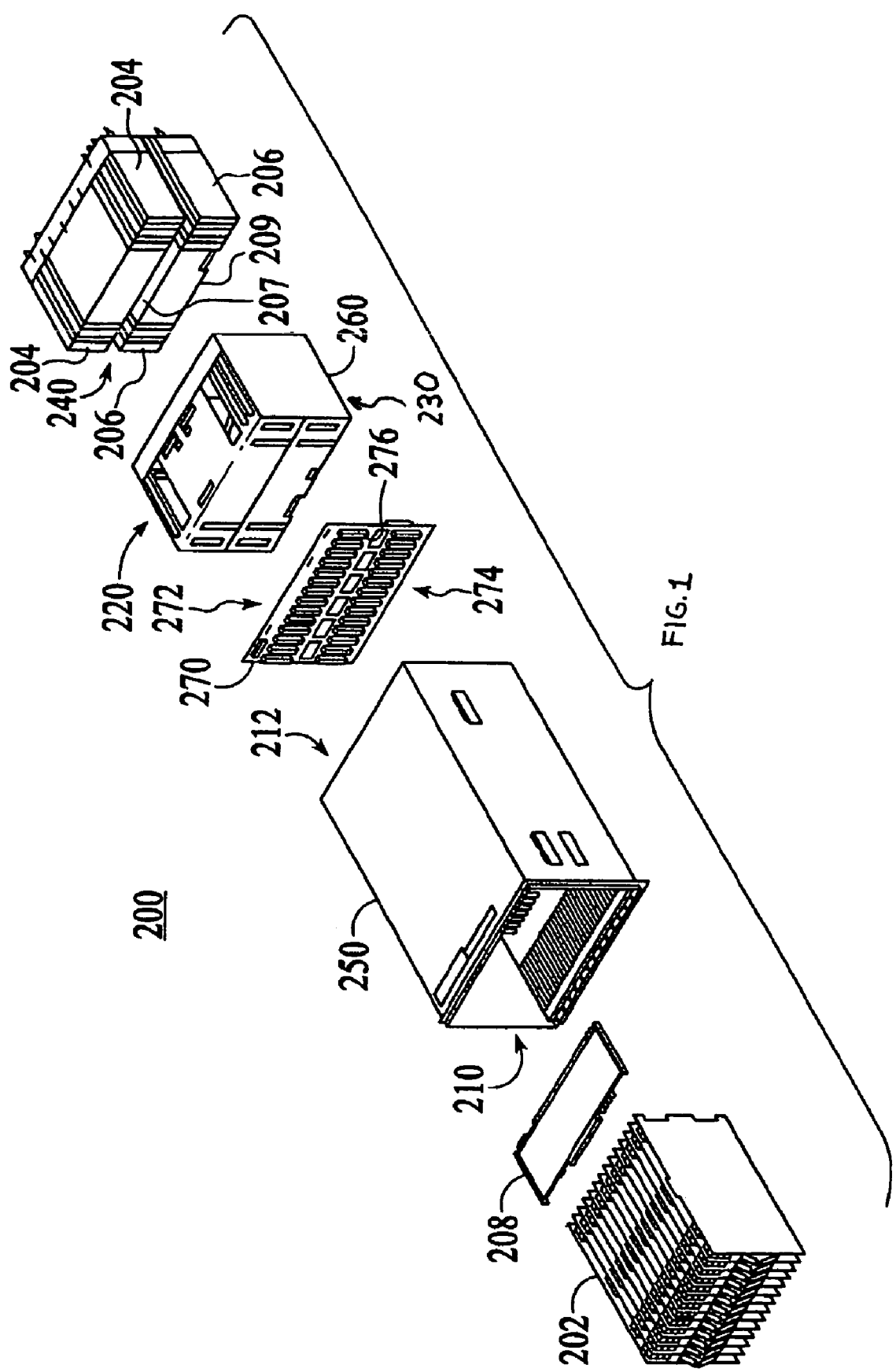

MIDPLANE CONNECTOR FOR BLADES

BACKGROUND OF THE INVENTION

1. Field of the Invention

The disclosure relates generally to computer systems and, more specifically, to a computer system and device for increasing bandwidth between a blade server and other devices within the computer system.

2. Description of the Related Art

FIG. 1 illustrates a system 200 for packaging a computer system. The computer system may include multiple blade servers 202, a first (top) set of devices 204, a second (bottom) set of devices 206, and a midplane 270. In addition, the computer system may includes blowers 207 and 209. The system 200 includes a main chassis 250 and a SPC chassis 260. The main chassis 250 includes a first cavity 210 and a second cavity 212. The first cavity 210 is configured to receive the blade servers 202, as well as a peripheral device 208. Additionally, the main chassis 250 may be configured such that each of the blade servers 202 is hot pluggable into the first cavity 210.

The SPC chassis 260 may be configured to retain the modules for the devices 204 and 206. In certain aspects, the devices 204 and 206 are hot pluggable into the SPC chassis 260. In addition, the SPC chassis 260 may be configured to plug into the main chassis 250. In particular, the SPC chassis 260 can be retained in the second cavity 212 of the main chassis 250. A common plenum 240 may be positioned between the modules for the devices 204 and 206 and between the blowers 207 and 209. The first plenum 220 may be formed above the SPC chassis 260 and between the SPC 260 chassis and the main chassis 250. The lower plenum 230 may be formed below the SPC chassis 260 and between the SPC chassis 260 and the main chassis 250.

The midplane 270 may be a printed circuit board to which the blade servers 202 and devices 204 and 206 connect. In addition, the midplane 270 includes apertures 276 in a central portion of the midplane 270. The apertures 276 in the midplane 270 provide a path for air from the blade servers 202 to the common central plenum 240. In addition, when in place, apertures 272 and 274 are formed between the main chassis 250 and the midplane 270. The apertures 272 and 274 provide a path for air from the blade servers 202 to the upper plenum 220 and lower plenum 230, respectively. Due to the arrangement of the plenum 220, 230 and 240, as well as the placement of the blade servers 202 and the devices 204 and 206, higher density packing of the blade servers 202 is possible while meeting the cooling requirements of the blade servers 202, devices 204, and devices 206.

FIGS. 2A and 2B respectively illustrate a conventional midplane 270 and blade server 202. The blade server 202 typically uses a pair of plugs 258 that plug into connectors 280 on the midplane 270. In conventional systems, only these interconnects 258, 280 are used to connect the blade server 202 to the midplane 270. As a result, all possible interconnections must be included in the midplane 270 to allow for flexibility in meeting the demands of differing applications. However, configuring the connectors 280 of the midplane 270 to meet all possible demands adds cost and complexity to the midplane 270. As a result, it can be economically undesirable to build additional functionality into the midplane 270 that is infrequently used.

Another issue associated with the conventional interconnects 258, 280 between a blade server 202 and midplane 270 is the continual need to increase the bandwidth between the interconnects 258, 280. Increasing the bandwidth typically involves increasing the number of wires per link and/or increasing the link speed of each wire. However, in many situations, a particular wire is already operating at a maximum operational datarate. In these instances, the only option is to increase the number of wires.

Issues are also associated with increasing the number of wires in the interconnects 258, 280. Adding wires/pins to the interconnects 258, 280 increases the complexity and cost of the midplane 270 itself since the additional wires from the interconnects 258, 280 requires additional and more complex wiring layers within the midplane 270, which is itself a circuit board., and exponentially increases the cost of the board. For example, to upgrade from a 1 Gb interconnect to a 10 Gb interconnect increases the number of wires for a single communication path from 4 to 16, which is a 4× increase in number of wires.

As illustrated in FIG. 1, if the midplane 270 is a shared midplane 270 such that the midplane 270 connects to blade servers 202 on one side and devices 204, 206 on the other side, the problem of additional bandwidth is exacerbated. The thickness of the shared midplane 270 is a critical component in ensuring the proper mechanical positioning and connection between the midplane 270 and both the blade servers 202 and devices 204, 206. Thus, to increase the thickness of the midplane 270 to accommodate additional wires for the increased bandwidth may require a redesign of many of the components within the system 200 to maintain proper spacing between the components.

Yet another issue associated with modifying the shared midplane 270 to accommodate increased bandwidth is to maintain the airflow through the apertures 276 of the midplane 270. Although increasing the surface area of the midplane 270 may increase the capability of the midplane 270 to accommodate additional wires, this modification of the midplane 270 would decrease the area of the apertures 276, which could result in insufficient airflow through the midplane 270 and through the system 200. There is, therefore, a need for a system and device for increasing the bandwidth between a blade server and other devices within the computer system without substantially increasing the complexity of the midplane or interfering with airflow through the midplane.

BRIEF SUMMARY OF THE INVENTION

Embodiments of the invention address deficiencies of the art in respect to computer systems and provide a novel and non-obvious system and device for increasing the bandwidth between a blade server and other devices within the computer system. The computer system includes a plurality of devices, such as components within a server blade system, a midplane, a supplemental midplane, and a peripheral device separate from the components. The midplane includes a plurality of connectors connecting the midplane to the plurality of components. The supplemental midplane is separate from the midplane and includes a body, a plurality of connectors, and a peripheral connector. The plurality of connectors are attached to the body and connect the supplemental midplane to the plurality of components. The peripheral connector is attached to the body and connects the supplemental midplane to the peripheral device. The plurality of connectors of the supplemental midplane communicate with the peripheral connector of the supplemental midplane. The plurality of connectors of the supplemental midplane are configured to be removably connectable to the midplane.

In certain aspects, the body of the supplemental midplane is a flex connector. Also, the midplane includes a plurality of apertures and at least a portion of the body is configured to extend through the plurality of apertures within the midplane. The midplane also includes pin through hole connectors adapted to receive the plurality of connectors of the supplemental midplane, and the midplane includes wires communicating with at least one connector of the supplemental midplane. The plurality of components each can include separate plugs for respectively connecting to the plurality of connectors of the midplane and the plurality of connectors of the supplemental midplane.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein:

FIG. 1 is an exploded perspective view of a system for packaging a computer system in accordance with the inventive arrangements;

DETAILED DESCRIPTION OF THE INVENTION

Figure 2A:
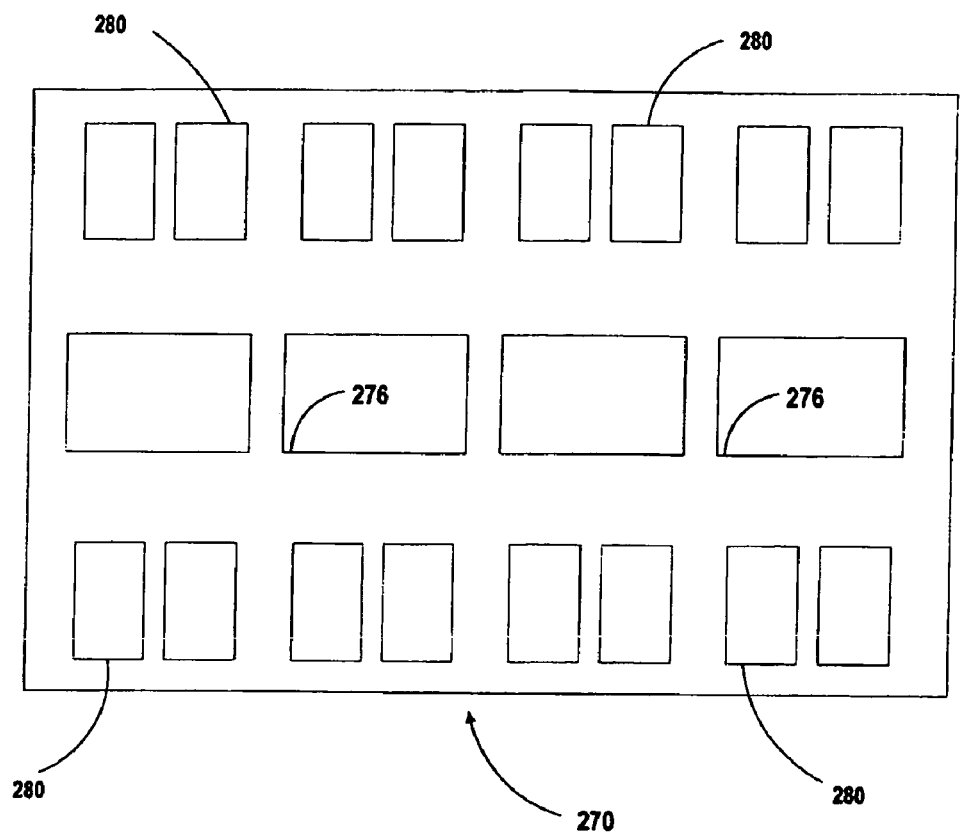
FIG. 2A is a front view of a conventional midplane
Figure 2B:
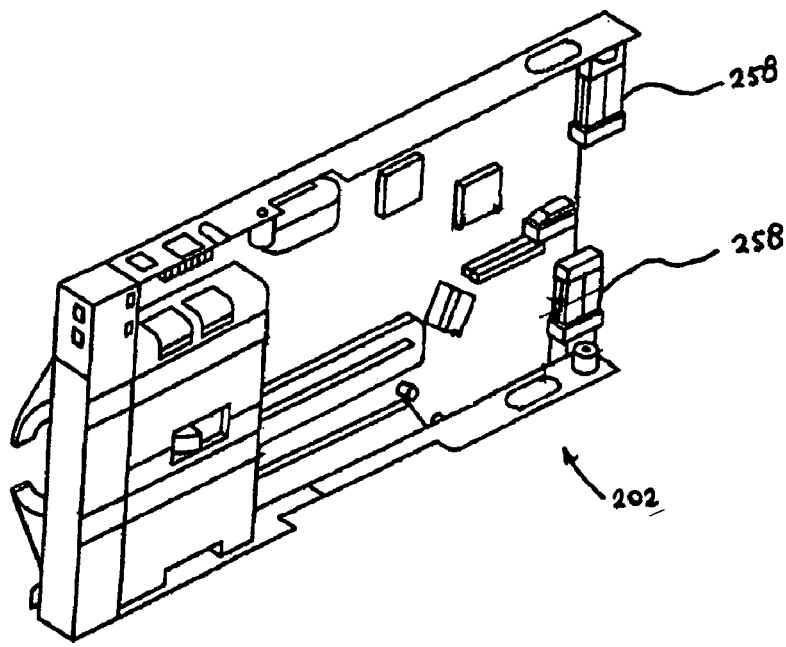
FIG. 2B is a perspective view of a conventional blade server.
Figure 3:
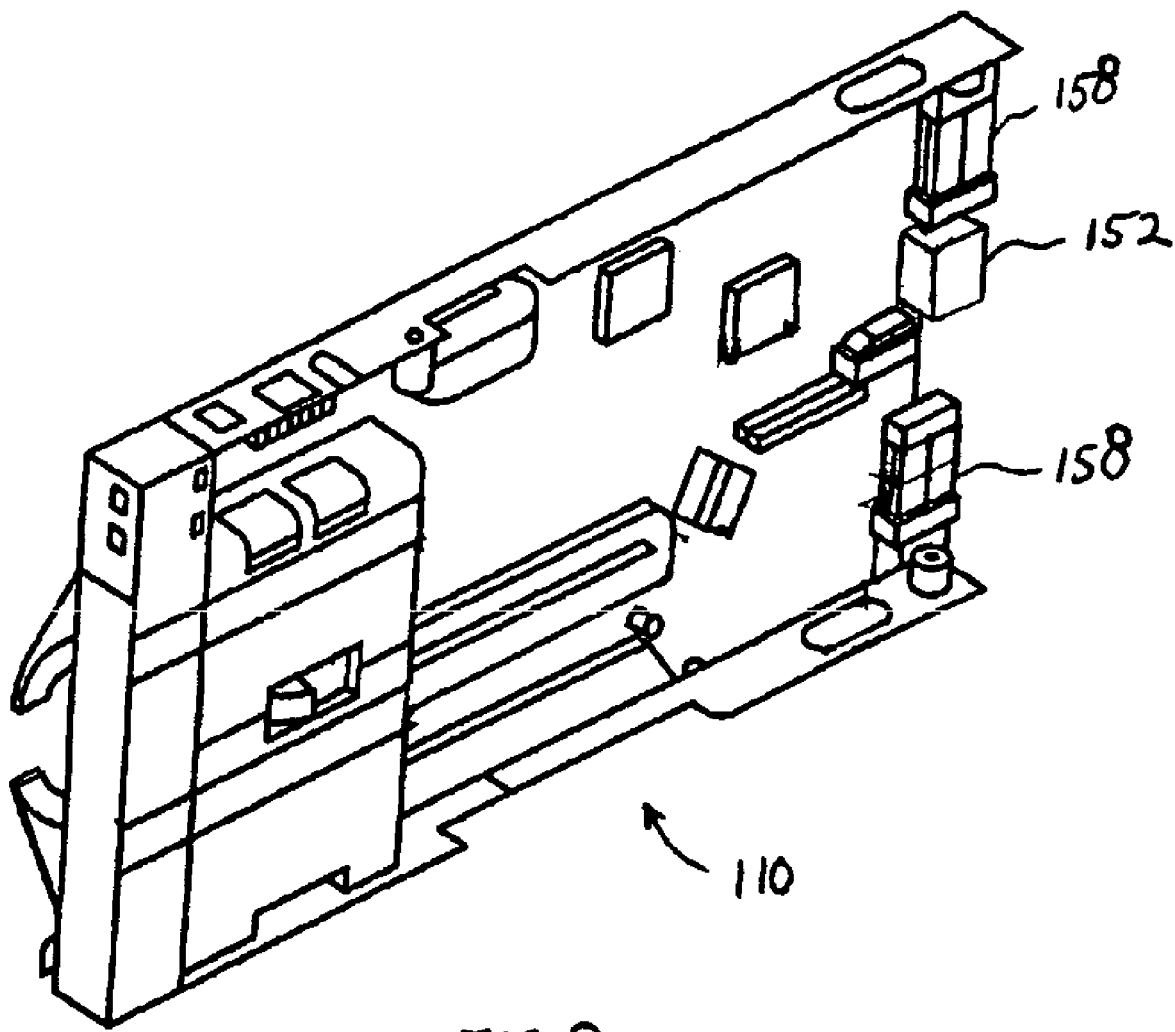
FIG. 3 is a perspective view of a blade server in accordance with the inventive arrangements.

FIG. 3 illustrates a blade server 110 that may be used with the system 200 for packaging a computer system illustrated in FIG. 1. In comparison to the conventional blade server 202 illustrated in FIG. 2B, although the present blade server 110 includes the pair of plugs 158 typically found on a blade server 110, the blade server 110 also includes at least one additional plug 152 separate from the plugs 158. The additional plug 152 may be configured to provide increased bandwidth and/or functionality to the blade server 110. Many types of interconnects are capable of connecting one device (i.e., the blade server 110) to another device, and the additional plug 152 of the blade server 110 is not limited as to a particular type of interconnect so capable.

Figure 4A:
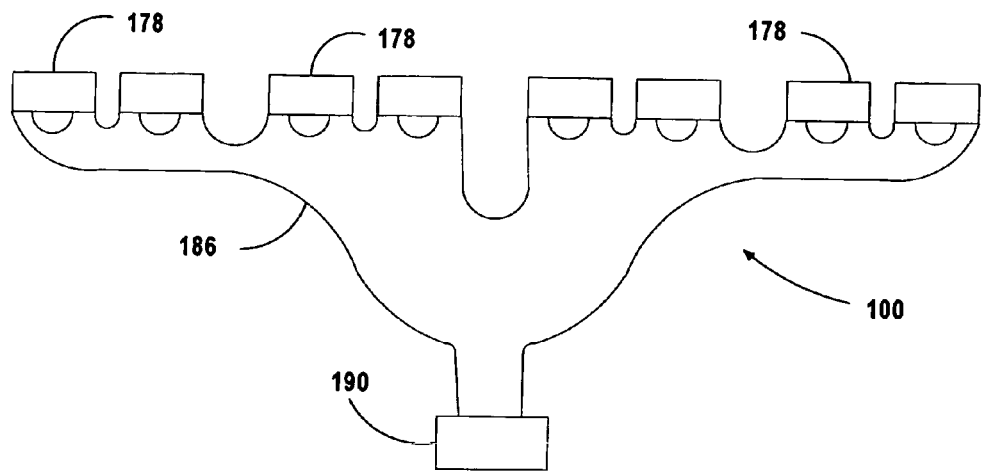
FIG. 4A is a plan view of a supplemental midplane in accordance with the inventive arrangements.
Figure 4B:
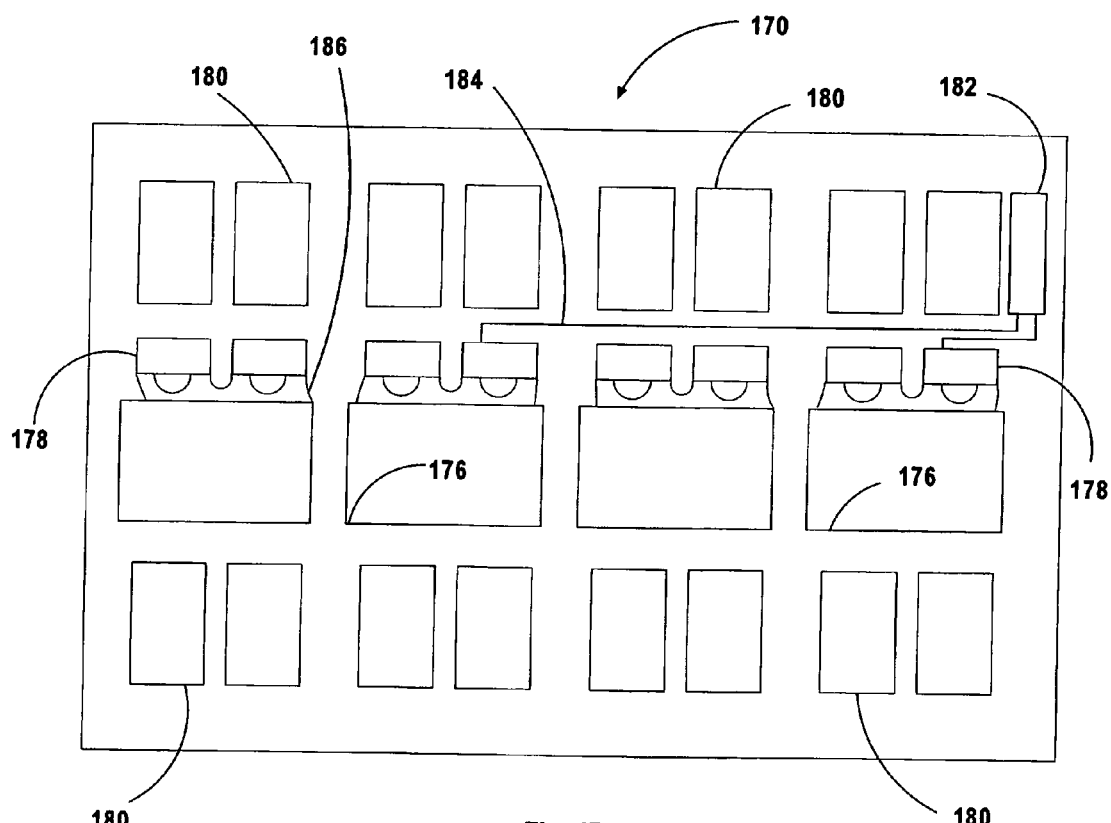
FIG. 4B is a view of the supplemental midplane attached to a midplane in accordance with the inventive arrangements.

FIGS. 4A and 4B respectively illustrate a supplemental midplane 100 and a midplane 170 to which the supplemental midplane 100 may be attached. The midplane 170 may be similar to the conventional midplane 270 illustrated in FIG. 2A and includes connectors 180 for receiving the plugs 158 of the blade server 110. The midplane 170 is also adapted to receive connectors 178 of the supplemental midplane 100. The connectors 178 of the supplemental midplane 100 are configured to mate with the additional plug 152 of the blade server 110 to form an interconnect between the blade server 110 and the supplemental midplane 100. Although described with regard to the midplane 170 being connected to one or more blade servers 110, the system 200 is not limited in this manner. For example, the midplane 170 may connect to other devices, for example, other components within a server blade system.

Although not limited in this manner, the supplemental midplane 100 is attachable to one or more other devices within the system 200. For example, the supplemental midplane 100 may attach to the peripheral device 208. In this manner, a communication connection between the peripheral device 208 and the blade server 110 can be made without adding additional wires to the midplane 100.

Additionally, the supplemental midplane 100 may be removably attachable to the midplane 170. In this manner, the supplemental midplane 100 can optionally be included with the system 200 illustrated in FIG. 1 or subsequently added to the system 200. Thus, those users that require the additional capabilities provided by the supplemental midplane 100 may request that the system 200 includes the supplemental midplane 100, and those users that do not need the additional capabilities can receive a system without the supplemental midplane 100 and the additional costs associated with the supplemental midplane 100.

The supplemental midplane 100 and the midplane 170 are not limited in the manner in which the supplemental midplane 100 may be attached (removably or not) to the midplane 170. For example, the supplemental midplane 100 may be permanently attached to the midplane 170. However, in certain aspects, the midplane 170 includes pin through holes (also known as PTH connectors) into which pins of the connectors 178 of the supplemental midplane 100 may be inserted. Pin through holes provide a structurally-sound connection between the connectors 178 of the supplemental midplane 100 and the midplane 170. Additionally, a particular pin through hole may be electrically isolated from the midplane 170 or the particular pin through hole may be electrically connected to a wire 184 within the midplane 170.

Although not limited in this manner, one or more of the pins/wires of the connectors 178 of the supplemental midplane 100 may be connected to wires 184 in the midplane 170, and the midplane 170 is not limited as where these wires 184 terminate. For example, the wires 184 may connect one connector 178 to another connector 178. In certain aspects, as shown, the wires 184 may lead to a connector 182 for a management and/or switch module located on the midplane 170. As an example of the relative number of wires in the interconnects 178, 190 in certain configurations of the connectors, about ten to fifteen wires 184 (e.g., for management signals) within the midplane 170 are connected to a connector 190 whereas the total number of wires between the interconnects 178 and connector 190 is approximately two hundred.

The supplemental midplane 100 is not limited as to a particular configuration. However, in certain aspects, the supplemental midplane 100 includes a body 186 formed from a flexible material (i.e., commonly referred to as flex connector). Although not limited in this manner, the flex connector may be a laminate of conductive layers (i.e., wires) covered by dielectric films. Additionally, since the supplemental midplane 100 is separate from the midplane 170 a different quality of material may be used for the supplemental midplane 100 than for the midplane 170. For example, for a particular application requiring the use of a particular material (e.g., a low dielectric insulating material), use of the low dielectric insulating material (and associated costs) can be limited to just the supplemental midplane 100.

The wires within the body 186 communicatively connect the connectors 178 to one or more peripheral connectors 190. The body 186 is not limited, as the midplane 170 typically is, to a particular size or shape, nor is the body 186 required to be configured to allow for the wiring of the midplane 170 or be mechanically attached to the midplane 170. The wires from the connectors 178 to the peripheral connector 190 can be more direct and, thus, made shorter than the wires might be if included within the midplane 170. The peripheral connector 190 is configured to attach to an additional device, such as the previously described peripheral device 208. Thus, a connection can be made between the peripheral device 208 and the blade server 110 using the supplemental midplane 100.

By forming the supplemental midplane 100 from a flexible material interference with airflow through the apertures 176 can be reduced. As illustrated in FIG. 4B, the supplemental midplane 100 may be attached to the midplane 170 by inserting the portion of the supplemental midplane 100 having the connectors 178 through the apertures 176 and connecting the connectors 178 to the midplane 170. The remainder of the body 186 of the supplemental midplane 100 may then be folded behind the midplane 170. As a result, the peripheral connector 190 (not shown in FIGS. 4B) of the supplemental midplane 100 may be on an opposite side of the midplane 170 than the connectors 178 of the supplemental midplane 100. In this manner, only a small portion of the surface area define by the apertures 176 are blocked by the supplemental midplane 100 extending through the apertures 176.

In another aspect, the remainder of the body 186 of the supplemental midplane 100 is folded forwarded in front of the midplane 170. As a result, the peripheral connector 190 (not shown) of the supplemental midplane 100 may be on the same side of the midplane 170 as the connectors 178 of the supplemental midplane 100. The combination of the blade servers 202, midplane 170, supplemental midplane 100, and the peripheral device 208 is not limited as to a particular positional relationship between the blade servers 202 and the peripheral device 208.

What is claimed is:

1. A computer system, comprising:
   a plurality of blade servers;
   a midplane including a plurality of connectors connecting the midplane to the plurality of blade servers, and the midplane including a plurality of cooling apertures;
   a peripheral device separate from the blade servers; and
   a supplemental midplane separate from the midplane, the supplemental midplane includes
      a body having a plurality of fingers respectively extending through the plurality of cooling apertures,
      a plurality of connectors attached to the body and connecting the supplemental midplane to the plurality of blade servers, and
      a peripheral connector attached to the body and connecting the supplemental midplane to the peripheral device, wherein
   the plurality of connectors of the supplemental midplane communicate with the peripheral connector of the supplemental midplane, and the plurality of cooling apertures remain open upon the plurality of fingers being positioned within the plurality of cooling apertures.

2. The computer system of claim 1, wherein the body of the supplemental midplane is a flex connector.

3. The computer system of claim 1, wherein the plurality of connectors of the supplemental midplane are configured to be removably connectable to the midplane.

4. The computer system of claim 1, wherein the midplane includes pin through hole connectors adapted to receive the plurality of connectors of the supplemental midplane.

5. The computer system of claim 1, wherein the midplane includes wires communicating with at least one connector of the supplemental midplane.

6. The computer system of claim 1, wherein the plurality of blade servers each include separate plugs for respectively connecting to the plurality of connectors of the midplane and the plurality of connectors of the supplemental midplane.

* * * * *